(12) United States Patent
Thorne

(10) Patent No.: US 7,222,036 B1
(45) Date of Patent: May 22, 2007

(54) METHOD FOR PROVIDING PVT COMPENSATION

(75) Inventor: Neil Kenneth Thorne, Finchley (GB)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/394,828

(22) Filed: Mar. 31, 2006

(51) Int. Cl.
G01R 25/00 (2006.01)

(52) U.S. Cl. .................. 702/79; 713/400; 713/401; 713/500; 713/600; 716/16; 716/17; 716/18; 327/262; 327/284; 327/378

(58) Field of Classification Search .......... 702/79; 713/400, 401, 500, 600; 716/161, 171, 18; 327/262, 284, 378
See application file for complete search history.

(56) References Cited

U.S. PATENT DOCUMENTS

| | | | | |
|---|---|---|---|---|
| 6,002,282 | A * | 12/1999 | Alfke .......................... | 327/165 |
| 6,631,503 | B2 * | 10/2003 | Hsu et al. .................... | 327/165 |
| 6,734,703 | B1 * | 5/2004 | Alfke et al. .................. | 326/38 |
| 6,819,157 | B2 * | 11/2004 | Cao et al. .................... | 327/262 |
| 6,983,394 | B1 * | 1/2006 | Morrison et al. ........... | 713/500 |
| 7,020,862 | B1 * | 3/2006 | Alfke et al. .................... | 716/6 |
| 7,024,326 | B2 * | 4/2006 | Nygren ......................... | 702/89 |
| 2002/0133789 | A1 * | 9/2002 | Hsu et al. ....................... | 716/4 |
| 2003/0001634 | A1 * | 1/2003 | Cao et al. .................... | 327/158 |
| 2003/0001650 | A1 * | 1/2003 | Cao et al. .................... | 327/277 |
| 2005/0020228 | A1 * | 1/2005 | Yearim ....................... | 455/260 |
| 2005/0097420 | A1 * | 5/2005 | Frisch et al. ................ | 714/742 |
| 2006/0038598 | A1 * | 2/2006 | Reilly et al. ................ | 327/261 |
| 2006/0267618 | A1 * | 11/2006 | Yuan et al. .................. | 324/763 |

OTHER PUBLICATIONS

"DDR2-533 Memory Design Guide For Two-Dimm Unbuffered Systems", Micron Technology, Inc., 2003, pp. 1-19, TN-47-01.

* cited by examiner

Primary Examiner—Carol S. W. Tsai
(74) Attorney, Agent, or Firm—Townsend and Townsend & Crew LLP

(57) ABSTRACT

Delays through components of a programmable device are determined transparently to the user through the use of mimic paths. For each delay path to be measured, at least one mimic path is created that has similar components and characteristics to the actual path to be measured. A signal fed through this mimic path will experience similar delay to a signal passing through the actual path, which can be affected by temperature and voltage variations during operation. A swept clock signal can be passed to a register latching the mimic signal data, producing output that can be fed to lead/lag logic to determine a current value of the delay through the mimic path. This delay can be compared to a previous delay determination to approximate an adjustment to be made to a sampling clock used to latch the actual data into the appropriate register at the middle of the latching window.

20 Claims, 9 Drawing Sheets

METHOD FOR PROVIDING PVT COMPENSATION

BACKGROUND OF THE INVENTION

The present invention relates to the field of programmable and other such devices, as well as systems and methods for programming the same.

Programmable devices, such as field programmable gate arrays (FPGAs), typically include thousands of programmable logic cells that use combinations of logic gates and/or look-up tables to perform logic operations. Programmable devices typically also include a number of functional blocks having specialized logic devices adapted to specific logic operations, such as adders, multiply and accumulate circuits, phase-locked loops, and one or more embedded memory array blocks. The logic cells and functional blocks typically are interconnected with a configurable switching circuit, which selectively routes connections between the logic cells and functional blocks. By configuring the combination of logic cells, functional blocks, and the switching circuit, a programmable device can be adapted to perform virtually any type of information processing function.

Programmable devices typically include one or more input/output (I/O) banks for communication with external devices, such as memory devices, network interfaces, data buses and data bus controllers, microprocessors, other programmable devices, application-specific integrated circuits (ASICs), or virtually any other type of electronic device. Each I/O bank is connected with a number of conductive I/O pins, balls, or other electrical connectors in the programmable device chip package. An I/O bank includes logic for sending and receiving data signals, control signals, or any other type of signal used in conjunction with communications between the programmable device and an external device.

The I/O banks of a programmable device typically include input and output buffers registers, flip flops, serial-to-parallel and parallel-to-serial converters, and control circuits and other circuits that together can be configured to provide one or more standard interfaces between the programmable device and external devices. Additionally, the I/O banks of a programmable device may be configured to provide custom or proprietary interfaces for a particular application.

In various configurations, the state of each data pin (e.g., DQ pin) in an I/O bank can be latched into registers upon the leading edge of a corresponding clock signal (e.g., DQS signal). For double data rate (DDR) interfaces, the pins can be allowed to switch again per the predetermined switching cycle, then have their values latched again upon the falling edge of the DQS signal (hence the double data rate). In order to avoid latching at or near the time that the data is switching, the data typically is latched using a clock signal that is phase shifted by 90° degrees so that the data is latched approximately half-way between switching times, typically referred to as the middle of the "eye" or "window." At startup of an FPGA device, for example, a data training cycle or other calibration process can be used to calibrate a sampling clock for read and/or write operations, putting the clock edges in the middle of valid windows.

Operations such as accessing an external memory after startup, however, can affect the timing performance of the device. For example, executing a number of read and write cycles tends to increase the temperature of the programmable device and affect the operating voltage levels across the device. The environmental temperature also can greatly affect the delay times for a device. These variations in temperature and voltage can affect numerous aspects of the device, such as the delay time encountered by a signal passing through a signal path on the device.

One way to address this problem is simply to use periodic data training cycles to re-calibrate the sampling clock, or at least to track changes due to factors such as voltage and temperature. Reading back training patterns while the user is reading and writing to the memory imposes on the user, though, which breaks the "transparency rule" for such devices. Transparency rules refer to requirements that processes be "transparent" to a user, in that the user does not notice the processes and the processes do not significantly interfere with user and/or device operation.

It therefore is desirable to allow for tracking and/or adjustment of these sampling clocks during operation of a programmable device, with the tracking and/or adjustment being transparent to a user of the device.

BRIEF SUMMARY

Systems and methods in accordance with various embodiments of the present invention approximate delays through various paths and/or components in a programmable device through the use of various mimic paths. Each mimic path can include a similar number of components having similar characteristics to those of a respective actual path to be evaluated, in order to approximate the delay through elements of the actual path as process parameters change without affecting the operation of the programmable device.

In one embodiment, a programmable device includes a first path including a first set of components. These components include at least a first data register used for latching actual data, such as from an external memory, and can include any other appropriate components such as input and output buffers. The first path is operable to carry a signal useful in operation of the programmable device, such as a clock signal output to an external device and a data signal fed back from the external device, although any of a number of other such signals are possible.

A second path in the programmable device is a mimic path, which includes a second set of components that correspond to the first set of components, including a second data register and any corresponding input and/or output buffers, etc. The mimic path is operable to carry a second signal that is not involved in operation of the memory device, whereby the mimic path can operate independent of operation of the memory device. A measurement clock source, such as a phase-locked loop (PLL) or delay-locked loop (DLL), generates a measurement clock signal that is applied to the second data register in order to latch data in the second signal into the second data register. This measurement clock signal has approximately the same frequency as the second signal in one embodiment, such that the phase of the measurement clock signal can be swept in order to compare the relative phase of the measurement clock and second signals. Logic circuitry, such as may include lead/lag logic and/or core logic, examines the output of the second data register in order to determine the positions of the data transitions in the signal and calculate any variation in delay relative to a previously determined delay value. The logic circuitry then can direct a clock source, such as the PLL or DLL, to adjust a sampling clock applied to the first data register in order to latch the data in the first signal near the middle of the sampling window, in order to avoid sampling problems due to varying delay caused by factors such as temperature and voltage variation.

Another embodiment utilizes multiple mimic paths for an actual path to be measured, each mimic path including a set of components similar to the components of the actual path. The results of each mimic path are analyzed to approximate the delay of the actual path. In one embodiment, each mimic path receives a signal tapped off the actual signal passed through the actual path. If the actual signal is a differential signal, each of two mimic paths receives one of the differential signal portions. Where the mimic paths receive the same signal, a slight phase offset can be introduced between each mimic path in order to improve the resolution of the mimic measurement.

Another embodiment utilizes a look-up table characterizing a delay element such as a DQS delay chain. In one embodiment, an initial output value, such as a DLL output value, and an initial delay time are obtained. The delay control values can be swept to obtain the initial control value to be used for the delay element. A look-up using this data can determine an initial transfer function for the delay chain. From this initial function, the desired delay time can be determined. At an appropriate time after startup, such as after any appropriate tracking update period, a current value of the DLL output is determined which can be used to determine a new transfer function. Due to limitations of storing a large number of transfer functions (to cover the many possible PVT points), an interpolation process can be used to determine the new transfer function. Once a new function is determined, a new control value corresponding to the appropriate delay time can be sent to the control input of the delay element to maintain the desired delay.

Other embodiments will be obvious to one of ordinary skill in the art in light of the description and figures contained herein.

BRIEF DESCRIPTION OF THE DRAWINGS

Various embodiments in accordance with the present invention will be described with reference to the drawings, in which.

DETAILED DESCRIPTION

Systems and methods in accordance with various embodiments of the present invention can overcome the aforementioned and other deficiencies in existing programmable and other such devices by providing a user-transparent approach to tracking timing or delay changes due to factors such as voltage and temperature variations during device operation. Such an approach can provide a calibration-based physical interface for external memories or other such components. While a start-up calibration process can compensate for process variations of a device, compensation for voltage and temperature can be enabled through measurement approximations of the delay, providing real-time PVT (process, voltage, and temperature) compensation.

Figure 1:
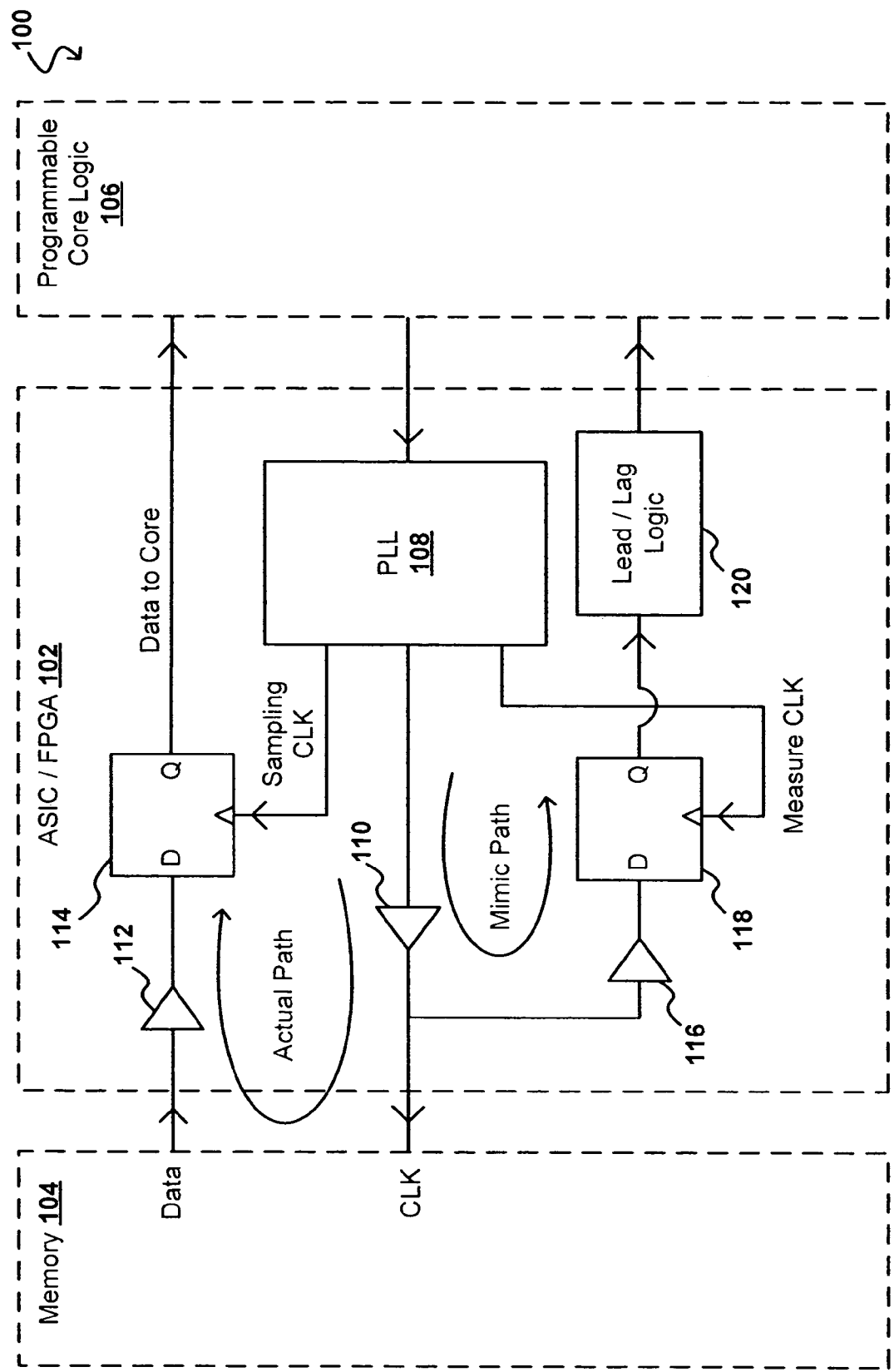
FIG. 1 illustrates the use of a single mimic path in a programmable device in accordance with one embodiment of the present invention.

FIG. 1 illustrates a system 100 utilizing a programmable device 102 such as an FPGA, ASIC, or other integrated circuit as known in the art. Although examples described herein will refer to FPGA and ASIC devices, it should be understood that aspects of the present invention can be practiced with any appropriate programmable device used, known, or subsequently developed, as well as any electronic device where it is desirable to measure or approximate variations in delay or other parameter(s) due to process, voltage, temperature, operation, or other such variables.

FIG. 1 shows an example of a standard read path using an FPGA interface 102, here illustrated as the "actual path." Although this example is described with respect to a read operation, it should be understood that aspects of the present invention also apply to write operations using similar devices and components. In this "actual" path, a signal such as a system clock signal is received by a phase-locked loop (PLL) 108, the signal being received in one embodiment from an appropriate off-chip source. The PLL 108 generates a clock signal, which can be a free-running periodic clock as known in the art, that is passed through an output buffer 110 and on to an external device, such as an external memory device 104, as an input clock signal useful for data latching. A corresponding data signal is received back from the external memory device 104, which is received by an input buffer 112. The data signal then is latched into the data (D) input of an I/O register 114, which can be a DDR I/O register or any other appropriate register operable for reading and/or writing data. A sampling clock signal is received from the PLL 108 at the clock input of the I/O register 114, allowing the data signal to be sampled near the middle of the window. An appropriate data signal then is passed from the Q output of the I/O register, then routed to an appropriate location, such as the programmable core logic 106.

As discussed above, the time it takes for the clock signal to pass through the output buffer 110 to the external memory, then for the data signal to pass back through the input buffer 112 and I/O register 114 to the data core can vary during operation of the programmable device. Typically, the delay experienced by the signals along the path can increase as the temperature of the device increases. The delay also can vary as the system voltage varies due to operation of different components, as well as variations in voltage requirements across the device. It is desirable to be able to compensate for these variations in delay in order to ensure that data is being sampled near the middle of valid latching windows.

The device of FIG. 1 approximates the variation in delay by utilizing a mimic path, or a path that approximates the actual path used by the programmable device to read and/or write data. In this example, the mimic path for carrying a signal (referred to hereinafter as the "mimic signal") includes a number and type of components similar to that of the actual path, and attempts to have an overall path length that is similar to that of the actual path (within a tolerance that can be determined by factors such as device design and performance requirements). The mimic path in this device utilizes the same output buffer 110 as the actual path, simply tapping off the output signal of the buffer. This tapped off signal then is fed to a mimic input buffer 116, which can be of the same type, or can have similar characteristics, as the actual input buffer 112. The path length from the output buffer 110 to the mimic buffer in the FPGA 102 can be approximately the same as the path length from the output buffer to an output connection/pin to the external memory device 104, and from an input connection/pin from the external memory device 104 to the actual input buffer 112. If a pin, pad, or other connector is used in the FPGA between the output buffer 110 and the external memory, a similar device can be added to the mimic path between the output buffer and the mimic input buffer 116, in order to more accurately reflect the sources for delay in the actual path.

The mimic signal then is latched from the mimic input buffer 116 into the data (D) input of a mimic I/O register 118. Passing the signal through a register similar to the register 114 of the actual path allows the mimic signal to pass through a similar number of similar components as the actual signal will experience, such that any delay experienced by the mimic signal will be approximately the same as the delay experienced by the actual signal, except for small differences between specific components and locations in the device.

The mimic register 118 can latch the mimic signal using a measure clock signal from the PLL 108, for example. This measure clock signal can be a continuous signal, which can be used to latch data from the free running clock signal passed through the mimic path. In other embodiments, including others described elsewhere herein, the signal used for the mimic path may not be a simple running clock signal, such that a different or variable measure clock signal can be appropriate as would be obvious to one of ordinary skill in the art in light of the description and suggestions contained herein.

Once the data from the mimic signal is sampled by the mimic register 118, the output from the mimic register is fed into logic 120 for determining the variation in timing of the mimic signal. As discussed below, the phase of the measurement clock supplied to the mimic register is swept, allowing the mimic register to do lead/lag detection, as the Q output of the mimic register is static for any given phase relationship but changes state (e.g., from 1 to 0 or 0 to 1) at the point where the relationship changes from lead to lag or lag to lead. Lead/lag logic 120, which can be a part of or separate from the programmable core, can receive the output from the mimic register and determine the delay in the signal by analyzing the points where the phase relationship changed state, or where the output from the mimic register changed between 0 and 1. The lead/lag logic can be in communication with any appropriate memory for storing a delay value determined thereby. Alternatively, or in addition to, the lead/lag logic 120 can feed the calculated delay value to the device core and/or a processing device operable to adjust the sampling clock signal fed to the actual I/O register 210 from the PLL 204, in order to latch the data from the external memory (or other) device 104 in the middle of the valid window. Approaches in accordance with other embodiments can use the calculated delay information to adjust at least one delay element (not shown) for the actual signal, which can help to adjust for any variation in the delay of the actual signal.

Figure 2:
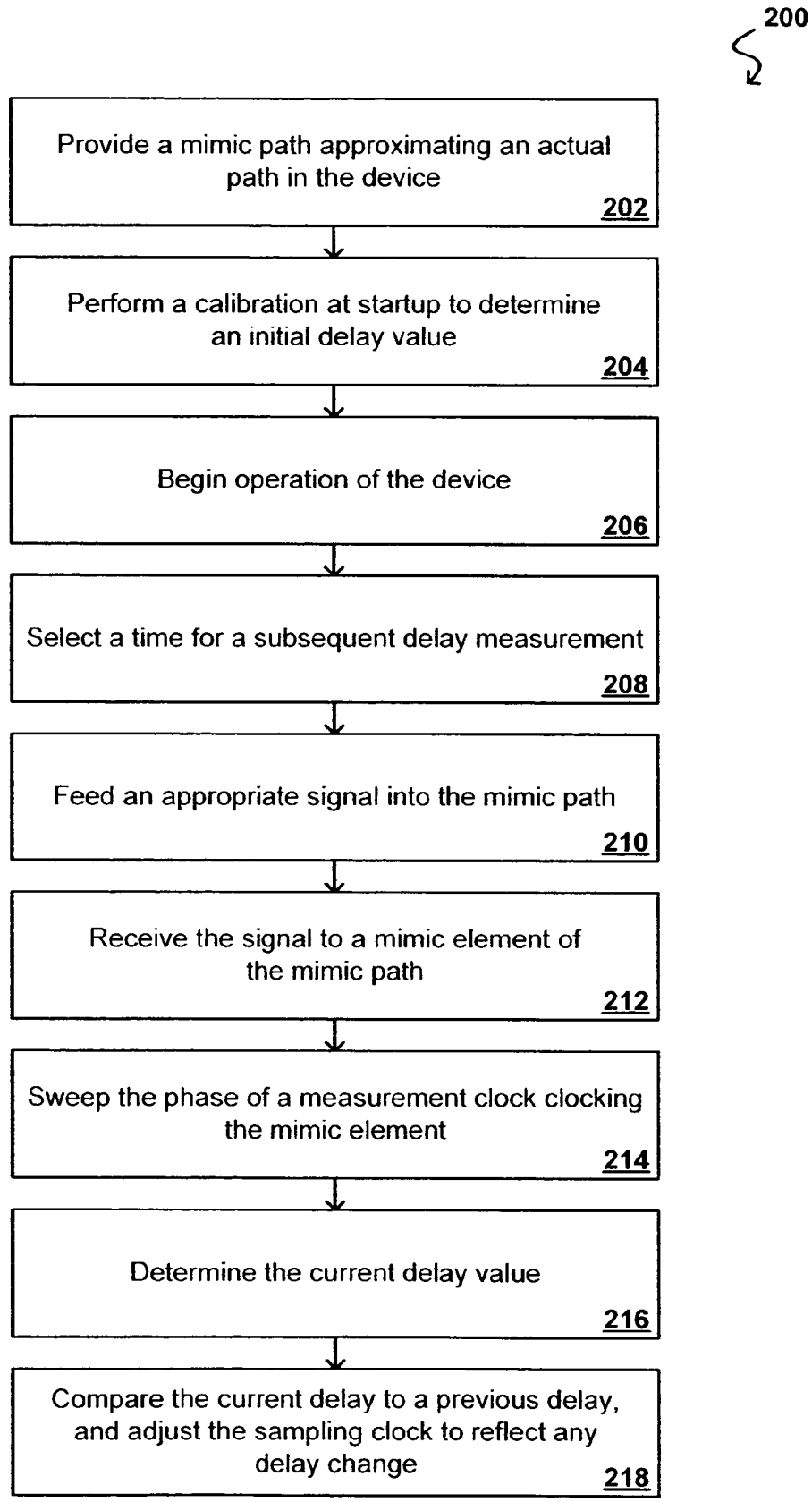
FIG. 2 illustrates the use of a dual mimic path in a programmable device in accordance with one embodiment of the present invention.

FIG. 2 illustrates steps of an exemplary method 200 that can be used in accordance with one embodiment of the present invention, and which will be described with respect to the exemplary device of FIG. 1. In such a method, a mimic path is created in a device such as an FPGA 202. The physical characteristics and components (pad delays, routing, registers etc.) of the mimic path are selected to closely match those of the actual physical path from the FPGA to the external memory and back again to the FPGA, which can cause delay in the signal, thereby moving the valid sampling window, otherwise referred to as the "read data eye." In the example of FIG. 1, this includes adding a mimic input buffer 116 and mimic I/O register 118 to match the actual input buffer 112 and I/O register 114, respectively, used for reading writing data from an external memory device 104.

At or around startup time for the device, a calibration step is executed to determine the initial delay 204. In this example, a signal is generated by a PLL 108, although a delay-lock loop (DLL) or any other appropriate component for generating a clock or other signal could be used to generate the calibration signal. If a DLL is used, it may also be necessary to use a delay chain where the delay of the delay chain is controlled by the DLL, and a clock signal then can go through that delay chain. The PLL 108 in this example passes the calibration signal to an output buffer 110, then taps off a portion of the signal from the output buffer and feeds that signal to an input buffer 116, which in turn feeds the mimic I/O register 118. A measure clock signal from the PLL, or other component, allows the register to latch the data and output a data signal to lead/lag logic circuitry 120. The lead/lag logic 120 can act as a phase detector, such as by comparing the received calibration signal with a separate clock signal or analyzing output from the mimic register resulting from sweeping the measurement clock signal, as discussed below, in order to determine the initial value of the delay (or phase change). This initial delay determination then can be fed the programmable core logic 106, for example, which can store this value to an appropriate memory, and/or can use the determination to adjust the sampling clock signal to be applied to the input register 114.

After the calibration step (or before, in some embodiments), operation of the device can commence 206. Using a time period specified in the device, either in memory or logic, a delay calculation can be initiated 208 some time after the initial calibration, after startup, or at any appropriate time as would be obvious to one of ordinary skill in the art. The period of time between measurements (calibration and/or subsequent delay measurement) can be fixed, at a value such as 10 ms to 128 ms in one embodiment, or can vary depending upon the design and characteristics of the device. For example, a device without any appreciable change in delay might make measurements at a first interval. Once the delay starts to vary, the time period might decrease. The time period can decrease in some proportion to the amount of variation in the delay, or by any other appropriate amount.

For the delay measurement step, the mimic path can be fed with a mimic signal 210, such as a continuous signal from a PLL 108 as in FIG. 1. In one embodiment, this signal is simply the DDR clock signal generated by the FPGA to be used in reading and/or writing to and/or from external memory. The signal can be any other appropriate signal, as discussed elsewhere herein. Using a signal such as a regular clock from an external source allows the mimic path to operate regardless of how the memory controller (or other such device) is being used. The use of a free-running clock allows the mimic path to have nothing to do with what is happening with the memory. Whether the user is reading or writing to the memory, or doing nothing, the same clock is still running through the mimic path. A phase detector then can make delay measurements at any time.

The mimic signal passes through the components of the mimic path, finally being latched into a mimic element such as mimic I/O register 118, or being latched into the D-input of a flop, which itself is part of the mimic path 212. The mimic I/O register 118 can be clocked by a measure clock signal, which can be received from the PLL 108 or from any other appropriate source. The measuring clock signal used to clock the I/O register can be swept by an appropriate amount, such as 360° 214. The output of the I/O register sampled with the sweeping clock then can be fed to lead/lag logic 120, which can determine the current shift in phase, or delay value.

The implementation of such a phase detector can be straightforward. In one example, the mimic I/O register 118 receives the mimic signal at the D input, and the clocking signal is received from the PLL. The frequency of the clocking signal in this case is the same as the frequency of the clocking signal sent from the PLL 108 through the mimic path. The phase of the measurement clock can be swept, allowing sampling of the mimic clock signal with another clock signal (the measurement clock) of the same frequency. The output of the mimic register 120 then will be "1" or "0", depending upon the relative phase of the mimic and swept measurement clocks. Sweeping the phase of the measurement clock allows the points where the output of the register switch between "0" and "1" to be monitored, such as by the lead/lag logic 120. Those two clock signals then are effectively lined up between the phase points where the output changed from "0" to "1", or "1" to "0".

The current delay value then can be fed to the programmable core logic 106, for example, wherein the current delay value can be compared with the initial calibration delay value, or a previous delay value 216. Any change in the delay value then can be used to adjust a sampling clock signal fed to an I/O register for the actual data path 218, such as the sampling clock signal fed from the PLL 106 to the actual t/o register 114. The difference between the startup calibration value and any subsequent delay value can represent quite accurately the eye movement, or shift in the valid measurement window, since the initial calibration. Adjusting the sampling clock then can ensure that the data is sampled near the middle of the valid window.

A process of sweeping the measurement clock to make delay measurements can be repeated as often as desired, as described above. Measurements in accordance with one embodiment typically will be repeated at a rate faster than the delay on the mimic path could ever change by more than one step. A problem might exist, however, in that such an approach can have a 180° phase uncertainty since only the points where the phase changes are measured. This typically will not be a concern, as an initial phase measurement is made, and the sufficiently short measurement interval ensures that the delay could not have changed by more than one phase step. It therefore can be desirable to make the interval a fraction of the phase step.

As discussed above, the operation of such a device can be controlled, at least in part, by an internal or external microprocessor and/or control logic. Such a device can control the PLL (or other appropriate component(s)) to sweep the phase of the measurement clock going into the clock input of the mimic register. In one example, the clock signal can do 16 phase sweeps, resulting in 16"1" and/or "0" values. The logic and/or processor can examine the string of 1's and 0's and determine the location of the change between 1 and 0. This location then can be compared to a previous location of the change between 1 and 0. If measurements are being made sufficiently often, there will either be no change at all since the last measurement or at most a change of one step up or one step down. The processor and/or logic then can direct the storing of this result in an appropriate memory, buffer, register, etc., track the time until the next measurement, then do another comparison. The cycles can continue as long as the device is in operation.

A problem that can exist in an active programmable device or related system involves various forms of jitter in the clock signals coming out of the FPGA or other system or components due to operations going on elsewhere in the system. One cause of such jitter is referred to in the art as simultaneous switching noise (SSN), generated by a large number of pins for the device switching at approximately the same time. The jitter created from such an occurrence might be larger than one of the phase steps of the relevant clock signals. When the jitter occurs near one of the step boundaries, such as one phase step on either side of a boundary, the clock might yield an erroneous output (e.g., a "1" when it should have switched to a "0"). In one embodiment, the jitter can be averaged out by feeding the Q output of this register into an averaging block or averaging device, which can be part of the lead/lag logic 120 or core logic 106. An averaging block can average the series of 1s and 0s coming out of the mimic register 118. For a system that averages over 16 clock cycles, for example, when not near a phase edge the Q output will be static ("1" or "0"). When averaged over 16 cycles, the average value will either be 0 or 1. If a summation approach is used, then the value will be either 0 or 16. If, however, the average is between 0 and 1 (or 0 and 16), that information can be used as additional phase information to indicate that a change occurred, and approximately where the change occurred. If the clock signal is jittering around and a few zeros are obtained, for example, then it can be determined that the average was probably closer to one phase edge than the other. By doing a little averaging on the outputs, additional phase information can be obtained in the presence of noise which can help to reduce the effects of jitter, thereby providing a slightly better resolution and a more robust solution.

Multiple Mimic Paths

Figure 3:
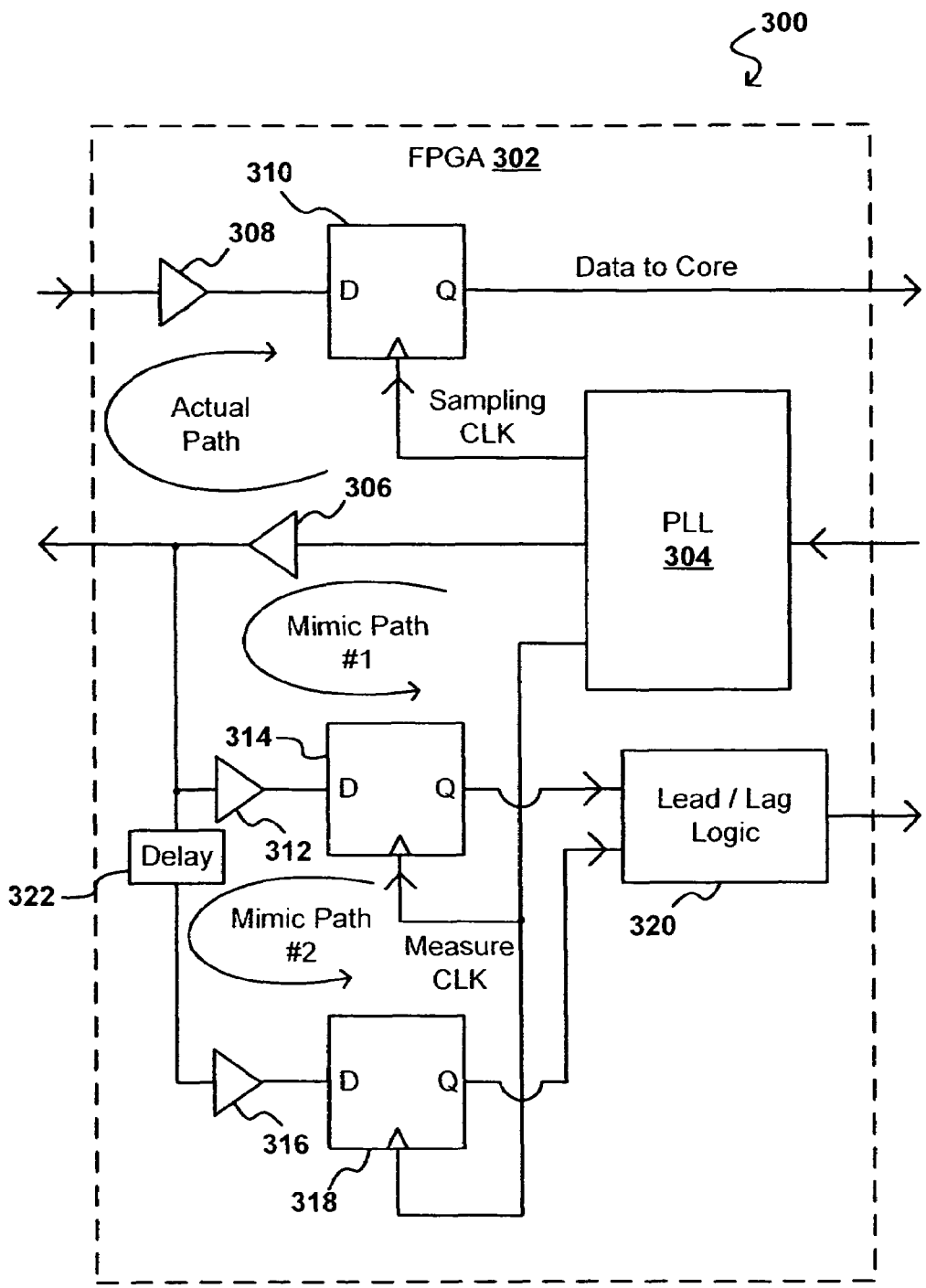
FIG. 3 illustrates the use of a dual mimic path useful with a differential clock signal in a programmable device in accordance with one embodiment of the present invention.

A way to further improve the delay measurement results is to utilize multiple mimic paths, such as is illustrated in the view 300 of FIG. 3. The external memory and programmable core logic are not shown for simplicity, but it should be understood that such an FPGA 302 can be used in any appropriate way as described and suggested above with respect to FIG. 1 or elsewhere herein. In this example, a PLL 304 is again feeding a continuous clock signal through an output buffer 306 to an external device, with a signal being returned through an input buffer 308 and into an actual I/O register 310, which uses a sampling clock signal from the PLL 304 to latch the incoming data in the middle of the window and send the resulting data on to the core. In this example, however, two mimic paths are tapped off the same point at the output of the output buffer 306. This mimic signal is fed to each of two separate mimic paths, with each mimic path including components matching the actual path, here a mimic input buffer 312, 316 and a mimic I/O register 314, 318. In one embodiment, the results of each mimic path are fed into the lead/lag logic 320, with an average being taken and the result being fed to the core logic or processor to be used in adjusting the sampling clock signal.

In another embodiment, a phase offset component 322 can be used to place a small offset on one of the mimic paths, in order to cause a slightly different delay for one of the mimic paths. If more than two mimic paths are used, a slightly different delay can be used for each mimic path. Offsetting the delays of the different mimic paths can provide slightly better phase resolution on the measure clock. For example, an FPGA at high frequency might only have available on the order of 16 phase taps. This limited number of taps means that the mimic path delay can only be measured to a resolution of $\frac{1}{16}$th of the clock rate. While this typically will be adequate, it could be desirable to have a higher resolution. By adding small offsets on the mimic paths, and comparing the switching location of each mimic path, a slightly more accurate representation of the location of each actual phase step can be obtained. In some embodiments, the additional complexity compared with the additional benefit might limit the use to about two or three offset mimic paths.

Figure 4:
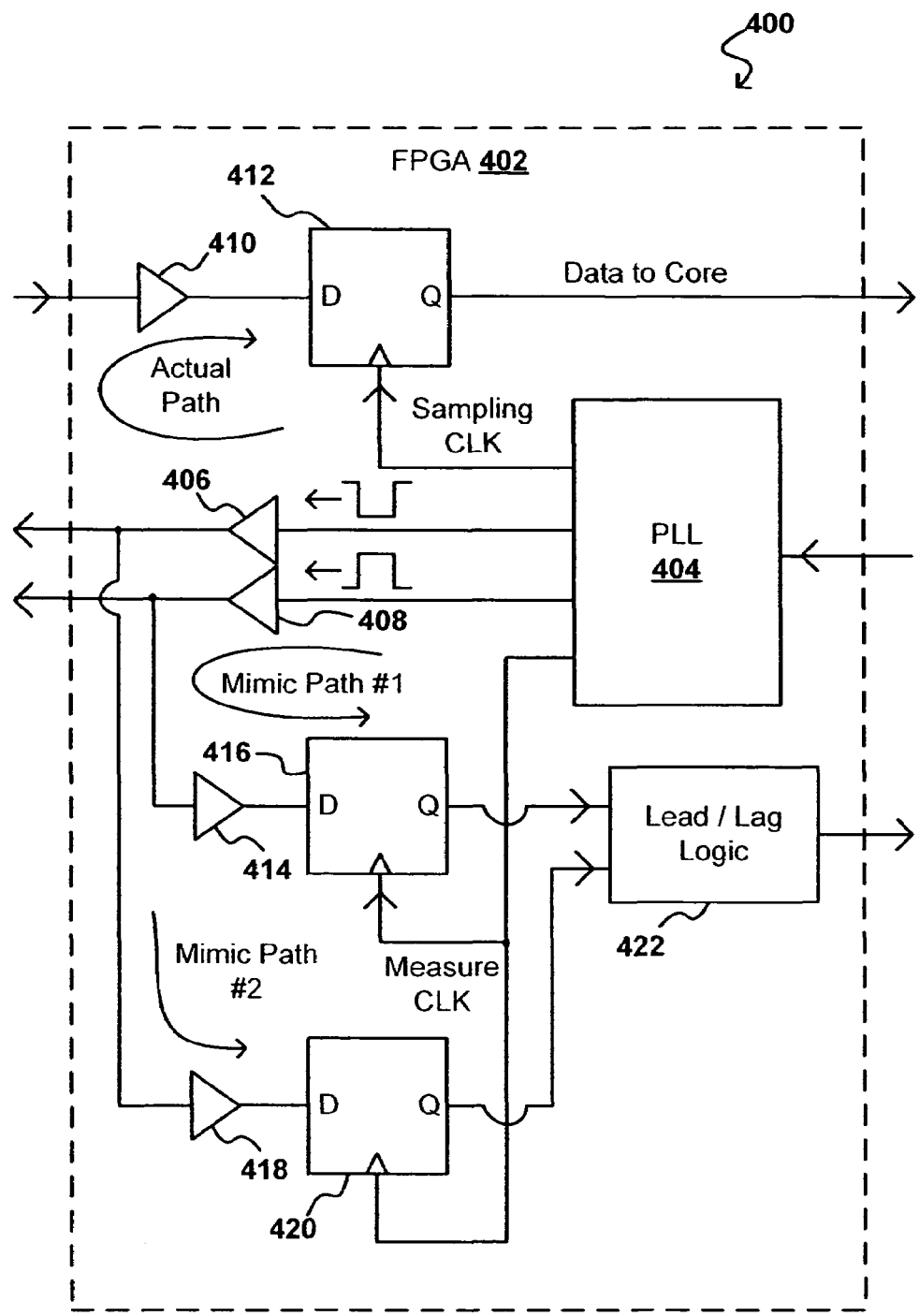
FIG. 4 illustrates steps of a method for transparently approximating delay in accordance with one embodiment of the present invention.

In some devices, the continuous clock signal from the PLL (or other source) will be a differential signal, meaning that there are effectively two signals that are essentially 180° out of phase (actually inverted) with respect to each other. These signals are typically referred to as a "clock" signal and a "clock bar" signal. The view 400 of FIG. 4 shows a PLL 404 outputting clock and clock bar signals, which can be fed to separate output buffers 406, 408. In such a system, either of those signals could be tapped off and fed to at least one mimic path, such as is described with respect to FIG. 1 or FIG. 2. In real systems, however, there typically are slight differences between the delay behavior of gates and other elements depending on whether rising or falling edges are going through those elements. Given that each mimic path for such a device is primarily a single extra register and a bit of routing, it can be desirable to create two mimic paths, one for the clock signal and one for the clock bar signal. Each mimic path then can have a respective input buffer 414, 418 and I/O register 416, 420 that can receive a measurement clock from the PLL 404. The data from the mimic I/O registers can be fed to the lead/lag logic 422, which can compute an average delay change for the differential signal to be applied to the sampling clock from the PLL, or can be used to compute a clock and a clock bar delay change, which can be used to adjust a first sampling clock signal for the actual clock path and a second sampling signal for the actual clock bar path. When doing a phase sweep as discussed above, most of the time the results would simply be 180 degrees out of phase. Due to subtle differences in the delays in the FPGA relating to rising and falling edges, however, there can occasionally be instances where the signals are one step out of phase. If the delay for one signal is between two phase steps, but the other delay is not quite 180° out of phase, an average of those results can be taken to provide a more accurate phase measurement.

Examples above are described with respect to DDR and other such FPGA devices, where the clock coming from the chip and driving the memory is simply tapped off and fed back as an input to the mimic path. Some memory devices, however, produce what is referred to as an "echo clock" coming back from the memory itself. This echo clock is typically a free-running clock, which in some embodiments would provide more accurate results if fed into the input(s) of the mimic path(s). This signal still is a free-running clock, but the signal actually comes from outside the chip, rather than being a simple feedback from something sourced on the chip. The principle for operation is essentially the same. One reason for using external clocks is that the arrival time takes into account additional delay variations in the system that the fed back clock version cannot take into account. This can be particular to certain types of memory, however, such as QDRII memory.

Another way to improve the accuracy is to use a complex signal, such as a pseudo-random sequence, to feed into the mimic path from the PLL (or another souce). Such a sequence, as is typically used in initial training sequences for these devices, can provide for detection of subtle differences between the relative positions of the phase edges, which can increase the resulting phase resolution.

Constant Delay Adjustments

An approach in accordance with another embodiment attempts to maintain constant delay values by accounting for PVT variation. A programmable or other electronic device such as a DDR device described above typically uses training patterns, which are written to external memory then read back again. In order to latch the data at the appropriate time, the delay value output from an element such as a DLL can be swept over a given range, such as a bit period, instead of sweeping a clock phase as in other devices. For a DLL with a 6-bit control output, for example, this can include sweeping over 64 possible delay settings in one embodiment. The control logic circuitry for the device can go through each of the delay settings from 0 to 63 at startup, for example, in order to obtain an initial PVT calibration. The control logic determines whether data is read successfully for each delay setting. Once the sweep is completed, the control logic determines positions across the sweep where the data read passed and where the data read failed. These positions can be used to determine the appropriate data eye 'mask', which defines the edges of the window wherein data can be read successfully. In one example, this window corresponds to data between delay settings 11 and 27, such that a midpoint of the window can be obtained using delay setting 19 (midway between boundary settings 11 and 27). This midpoint is optimal within the step resolution of the delay time. As known in the art, a DLL can control the delay in order to latch data near the middle of the data eye, but there is no practical way to include enough specific values in the DLL to handle any possible delay value, and the optimal value for any given system will typically be a random value.

A problem exists in that the midpoint control value corresponding to the delay setting of 19 likely will not correspond to the midpoint of the window once the temperature and/or voltage of the device begins to change. If voltage and temperature were constant, a constant delay control value could be used. Since voltage and temperature change, however, it can be desirable to adjust the delay control value in order to maintain the appropriate delay to latch data at the midpoint of the data eye. Since the initial calibration procedure determines the appropriate timing delay (such as 123 ps, for example), it can be desirable to adjust the delay control value during operation to maintain the timing appropriate timing delay at this constant value (e.g., 123 ps) during the operation of the device.

Figure 5:
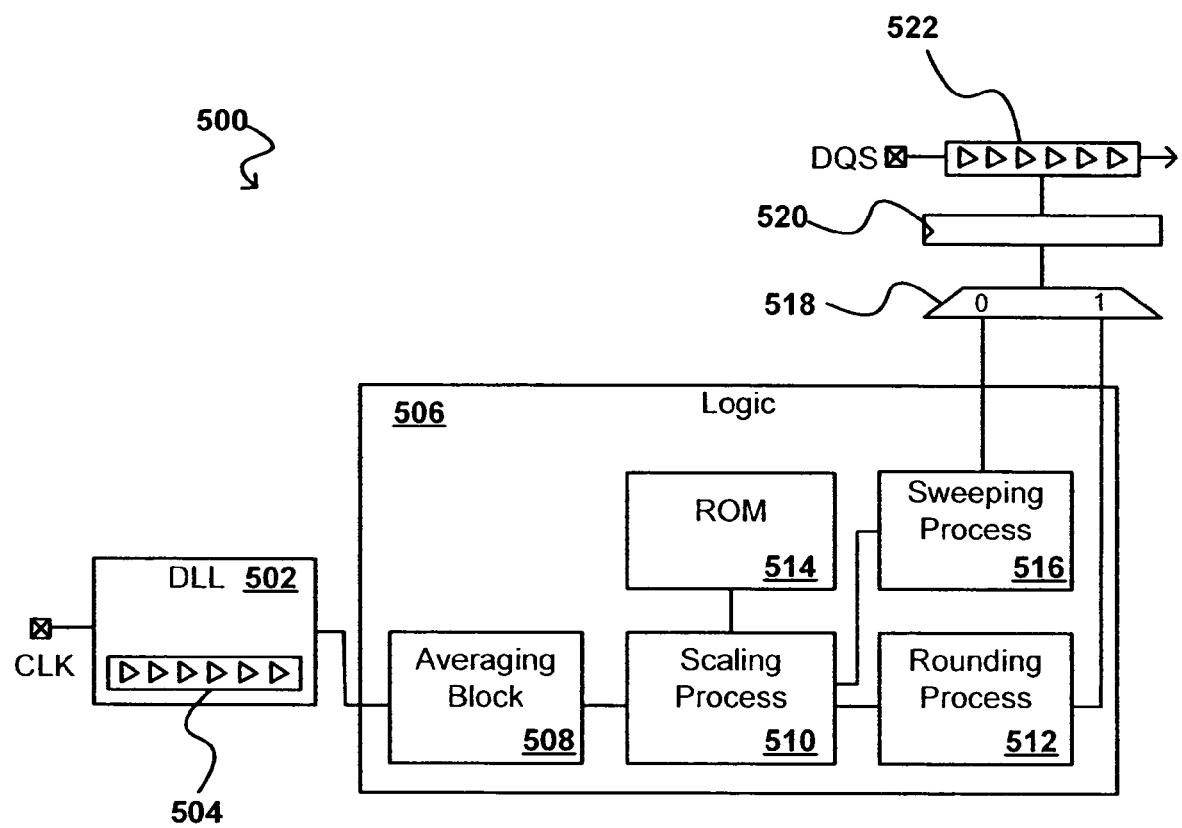
FIG. 5 illustrates the use of a look-up table to provide a constant delay in a delay element in accordance with one embodiment of the present invention.

A device in accordance with one embodiment accounts for PVT variation using at least one look-up table characterizing the performance of the delay chain in both the programmable device's DLL and I/O cell. As illustrated in the exemplary arrangement 500 of FIG. 5, a DLL 502 can receive an input clock signal, such as a system clock input, and produce an output signal. The DLL can include at least one delay chain 504, containing an appropriate type and number of delay elements that substantially match the elements of the DQS delay chain 522 as discussed later herein. As the output of a DLL is known to include some amount of jitter, an averaging block 508 can receive the DLL output and can average the output over an appropriate amount, such as over about 100 samples, in order to produce a more stable DLL output signal. In one example, the output of the DLL is a 6-bit output, while the output from the averaging block 508 is an 8-bit output. The output from the averaging block can be the DLL output values $D_o$ and $D_{current}$ discussed below.

The logic portion 506, which can include both hard and soft logic, provides a first output to a multiplexer 518 for an initial calibration process. A sweeping process 516 directs output values over a given range (such as 0–63) through an input (0) of the multiplexer 518 and a register 520 to the DQS delay chain 522, such that a number of different delays can be applied to the delay chain in order to determine the boundaries of the data window as discussed above.

The logic portion 506 subsequently provides a second output to another pin (1) of the multiplexer 518 DLL tracking. In tracking the DLL value, and thus evaluating the delay settings, a scaling process 510 calculates a new control value to be applied to the DQS delay chain 522 using the initial value of the DLL output, a current value of the DLL output (as affected by voltage and temperature variations), and the initial integer control value that was determined in the initial calibration process using the sweeping process 516. A look-up table stored in ROM 514 in the control logic 506, for example, can store characteristics of the delay chain such that these inputs can allow for a determination of the appropriate control value to maintain the desired delay timing as discussed below. The control logic in one embodiment receives an update control signal that is indicative of voltage and/or temperature having changed sufficiently that the delay value should be re-evaluated. In other embodiments, the evaluations are done sufficiently often that such an input signal is not necessary. For example, the value can be evaluated every 128 ms.

Figure 6:
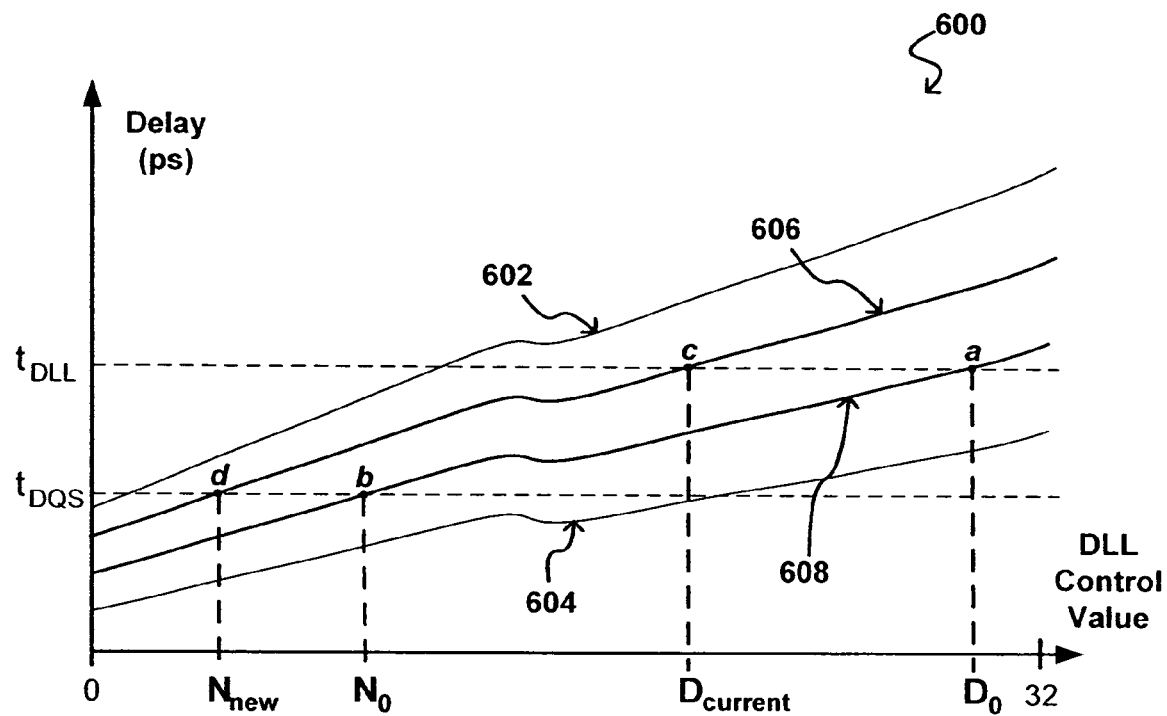
FIG. 6 illustrates the characteristics of a device in accordance with one embodiment of the present invention.
Figure 7:
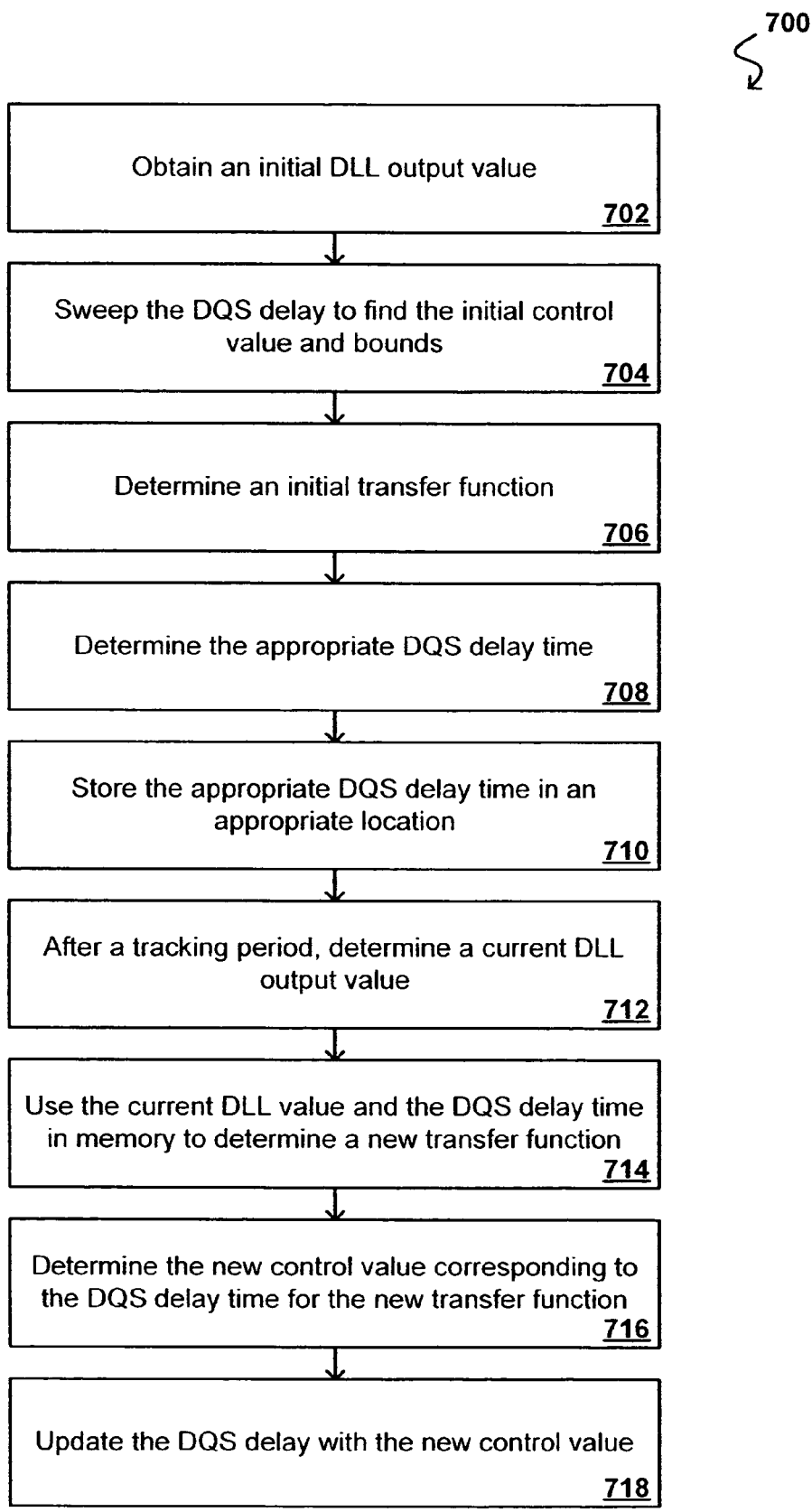
FIG. 7 illustrates steps of a method for providing a constant delay in a delay element in accordance with one embodiment of the present invention.

A process for determining an updated control value using such an arrangement can be described with respect to the graph 600 of FIG. 6 and the flowchart of FIG. 7. The lines of this graph represent characteristic data for an exemplary delay chain, representing data for all possible PVT points of the device. Since there can be an infinite number of such points, which cannot be stored in the device, a sampling can be used with includes curves for the upper 602 and lower 604 bounds, as well as representative points 608 in-between. Using these representative curves, any other curve can be approximated through an appropriate interpolation process as known in the art.

In a method 700 in accordance with one embodiment, an initial DLL output value $D_0$ is obtained at the initial calibration time 702. The DLL value equates to a delay $t_{DLL}$, which will not change across PVT. The delay $t_{DLL}$ typically is chosen for a device in order to meet lock-range requirements, but could be increased to obtain improved accuracy and/or resolution. In this example, it will be assumed for simplicity that the DLL contains only a single DQS delay chain and that $t_{DLL}$ is equivalent to 360°, although other values may be appropriate as known in the art.

From the initially obtained delay time $t_{DLL}$ and output value $D_0$, point (a) on the graph can be determined. As discussed above, the delay control values of the DQS delay chain in the I/O can be swept to obtain the initial control value No (e.g., 19) for the DQS delay chain 704. A look-up using point (a) can determine the appropriate transfer function (curve 608) for the delay chain at the PVT point at initial calibration time 706. From $N_0$ and the initial curve 608, the delay $t_{DQS}$ at calibration time can be determined, represented on the graph at point (b) 708. In the above example, the actual delay $t_{DQS}$=123 ps. The control logic then can store the value of $t_{DQS}$ in an appropriate location 710.

During tracking, it is desirable to maintain the same DQS delay ($t_{DQS}$) as was determined at startup (the determination needed as $t_{DQS}$ can be a seemingly random value). At an appropriate time after startup, such as after any appropriate tracking update period, the device can determine whether the control value needs to be adjusted in order to maintain this constant $t_{DQS}$ value. In one exemplary algorithm, the control logic determines a current value of the DLL output ($D_{current}$) 712. Since $t_{DLL}$ is already known for the device, this provides point (c) on the graph. Because a characteristic curve typically will not exist that precisely intersects with point (c), an interpolation algorithm can be used to generate a curve 606 that is representative of the device for the current operating conditions 714. As discussed above, this can be any appropriate interpolation process known or used in the art for such purpose. Once a current curve 606 is determined, the appropriate point on the curve can be determined that corresponds to the desired $t_{DQS}$ value, giving the new control value $N_{new}$ to be sent to the control input of the delay chain to maintain the desired value of $t_{DQS}$ 716. The appropriate new control value then can be written to the register holding the current delay value for the DQS delay chain 718. Although this method is described with respect to a particular DQS delay, advantages of such a method can be used advantageously with any of a number of other systems, devices, and arrangements as would be apparent to one of ordinary skill in the art.

As discussed above, it can be desirable to repeat this determination sufficiently often to ensure that the required control value will not change by more than one step (e.g., from 19 to 20) between determinations. If the frequency with which such a process is performed is faster than voltage and temperature can change, $N_{new}$ will rarely change from one step to the next, and even then will only change by +/−1. Such a process also will calculate $N_{new}$ to a value that is more precise than necessary, which can be rounded to six bits. The end result is that the phase error, or control value error, is optimal as an error value of 0.5 matches the resolution of the delay chain in this embodiment.

In implementing such a process, a delay chain in the I/O element being controlled should be similar, if not identical, to a delay chain inside the DLL so that the variations due to temperature and voltage will similarly affect each delay chain. The lookup table stored in ROM in this example is representative of the DLL delay chain, and therefore should also be representative of the delay chain being controlled. The DLL can output a value $t_{DLL}$, which can be completely different from total value $t_{DQS}$ being controlled. It is only through use of the look-up table and interpolation on the look-up values that the DLL can control any delay value. A DLL normally controls a delay element for a specific delay value(s). Using a process such as those described herein allows any delay to be controlled using such a DLL.

Figure 8:
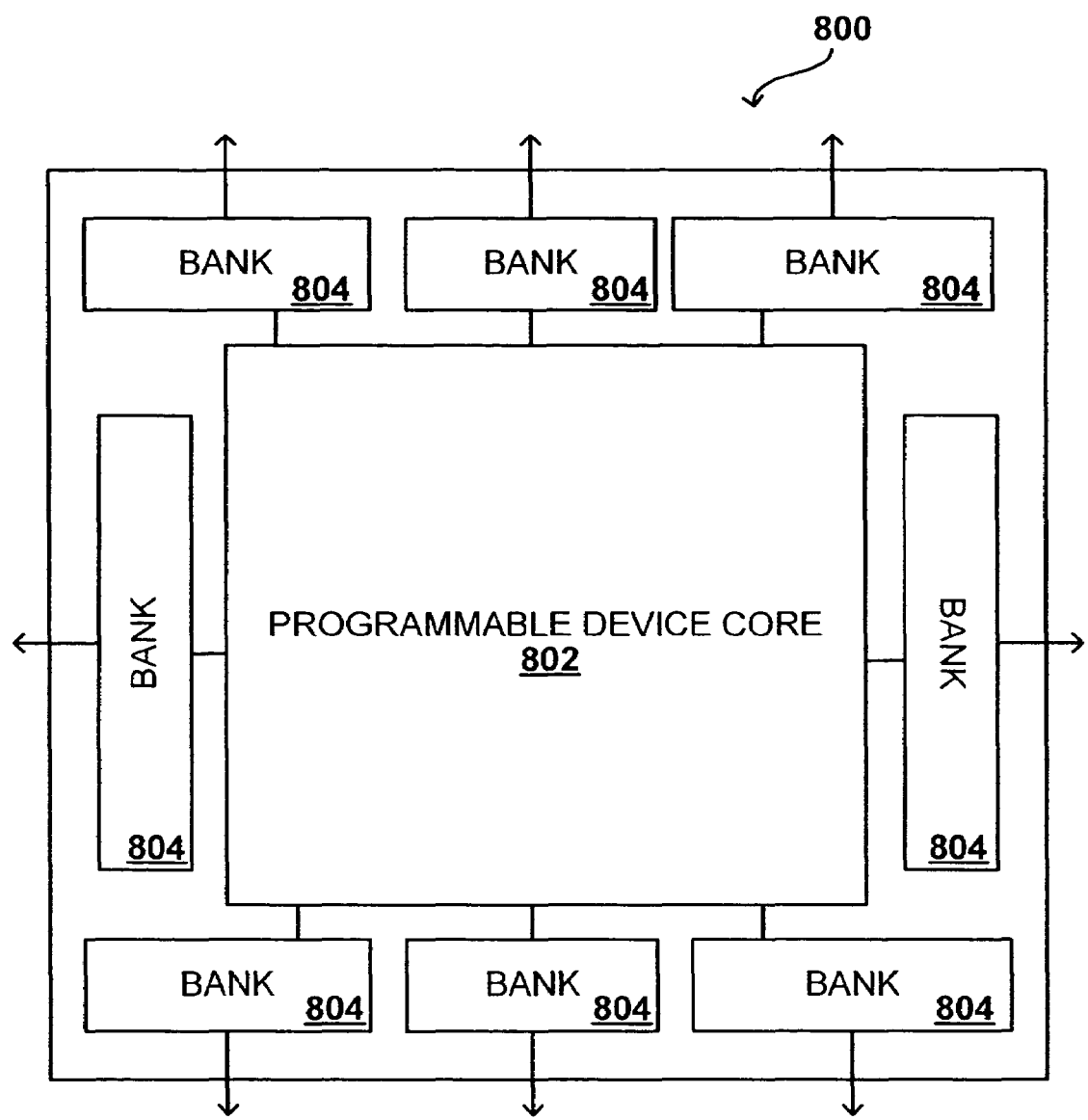
FIG. 8 is a diagram of a programmable device and I/O bank architecture that can be used in accordance with one embodiment of the invention.

FIG. 8 illustrates an exemplary I/O bank architecture 800 for a programmable device that can take advantage of the delay compensation techniques described above. This architecture 800 includes a programmable device core 802, which can include programmable device components such as logic cells, functional blocks, memory units, and a configurable switching circuit as known in the art. This device architecture 800 also includes a plurality of I/O banks 804. Such an architecture can allow for any number of I/O banks, of the same or different size, containing any appropriate number of I/O pins. The number of I/O pins for each I/O bank can be specified, for example, based on the common interface types to be implemented by the I/O banks. If necessary, two or more I/O banks can be aggregated to implement a single interface.

Figure 9:
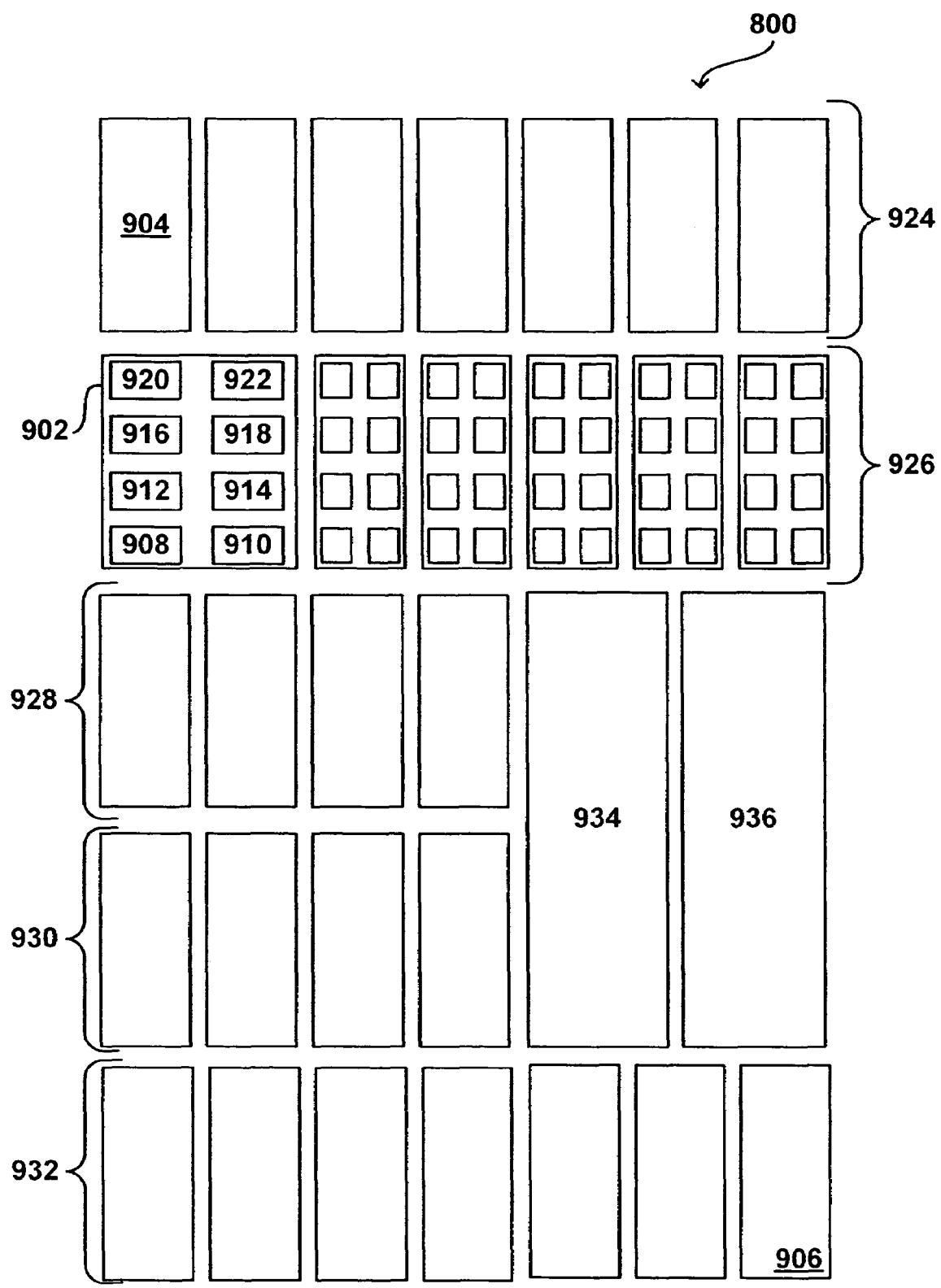
FIG. 9 is a diagram of a programmable device core that can be used in accordance with one embodiment of the invention.

An exemplary programmable device core that can take advantage of the architecture of FIG. 8 is illustrated in FIG. 9. This exemplary programmable device 900 includes a number of logic array blocks (LABs) 902, 904, 906. Each LAB includes a number of programmable logic cells using logic gates and/or look-up tables to perform logic operations, as well as registers to store and retrieve data. LAB 902 illustrates in detail various logic cells 908, 910, 912, 914, 916, 918, 920, and 922. Logic cells are omitted from other LABs in FIG. 9 for clarity. The LABs of this device 900 are arranged into rows 924, 926, 928, 930, and 932. The arrangement of logic cells within a LAB, and of LABs within the various rows, can provide a hierarchical system of configurable connections of the programmable switching circuit.

In addition to logic cells arranged in LABs, this programmable device 900 also can include specialized functional blocks, such as a multiply and accumulate (MAC) block 934 and a random access memory (RAM) block 936. The configuration of the programmable device can be specified at least in part by configuration data stored in configuration memory (not shown). The configuration data can include values for lookup tables defining, for example: the functions of logic cells; values of control signals for multiplexers and other switching devices used by the configurable switching circuit to route signals between inputs, outputs, logic cells, and functional blocks; and/or values specifying other aspects of the configuration of the programmable device, such as modes of operation of the programmable device and its assorted functional blocks and logic cells. The configuration memory can be a monolithic unit, or can be scattered across the programmable device. In these types of programmable devices, portions of the configuration memory can reside within the logic cells, functional blocks, and configurable switching circuit of the programmable device.

For clarity, the portion of the programmable device 900 shown in FIG. 9 only includes a small number of logic cells, LABs, and functional blocks. Typical programmable devices can include thousands, tens of thousands, or more of these elements.

Further embodiments can be envisioned to one of ordinary skill in the art after reading the disclosure herein. For example, although the invention has been discussed with reference to FPGAs and programmable devices, it is equally applicable to standard or structured ASICs, gate arrays, and general digital logic devices. In other embodiments, combinations or sub-combinations of the above disclosed embodiments can be advantageously made. The block diagrams of the architecture are grouped for ease of understanding. However it should be understood that combinations of blocks, additions of new blocks, re-arrangement of blocks, and the like are contemplated in alternative embodiments of the present invention.

While the embodiments are described with respect to the DDR-II standard, advantages of the various embodiments can be used with DDR-III, DDR, SDR, QDR, QDR II, QDR III, RLDRAM-II, or any other appropriate memory interfaces. Further, although the embodiments are described with respect to 8-bit bases, 9-bit or other bases could be used as well. Embodiments also can be used with other wide interface applications, such as PCI and PCI Express. Embodiments also can be used with any appropriate application, not just with external memory. Any application for which a tracking of delay would be beneficial can utilize approaches in accordance with the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A system for approximating delays in a programmable device, comprising:
a first path in the programmable device, the first path including a first set of components including a first data register and operable to carry a first signal useful in operation of an external device;
a second path in the programmable device, the second path including a second set of components including a second data register, the second path operable to carry a second signal independent of operation of the external device, each component in the second set of components corresponding to a similar component in the first set of components;
a measurement clock source operable to generate a measurement clock signal applied to the second data register in order to latch data in the second signal into the second data register; and
logic circuitry operable to receive output from the second data register and determine a delay for the second signal in response thereto.

2. A system according to claim 1, wherein:
the measurement clock source is further operable to sweep a phase of the measurement clock signal applied to the second data register.

3. A system according to claim 2, wherein:
the logic circuitry determines the delay for the second signal by analyzing transitions in the output from the second data register resulting from sampling the second signal using the swept phase measurement clock signal.

4. A system according to claim 1, wherein:
the second path has a second path length approximately equal to a first path length of the first path.

5. A system according to claim 1, wherein:
the external device is an external memory device.

6. A system according to claim 1, wherein:
the components in the first and second sets of components are selected from the group consisting of buffers, registers, pads, pins, and routing elements.

7. A system according to claim 1, wherein:
the measurement clock source is selected from the group consisting of phase locked loops and delay locked loops.

8. A system according to claim 1, wherein:
the measurement clock source is further operable to output a sampling signal input to the first data register for latching data in the first signal.

9. A system according to claim 8, wherein:
the measurement clock source adjusts the sampling signal based on the delay determined by the logic circuitry.

10. A system according to claim 1, wherein:
the first and second signals are derived from a common signal from the measurement clock source.

11. A system for approximating delays in a programmable device, comprising:

a first path in the programmable device, the first path including a first set of components including a first data register and operable to carry a first signal useful in operation of an external device;

a second path in the programmable device, the second path including a second set of components including a second data register, the second path operable to carry a second signal independent of operation of the external device, each component in the second set of components corresponding to a similar component in the first set of components;

a third path in the programmable device, the third path including a third set of components including a third data register, the third path operable to carry a third signal independent of operation of the external device, each component in the third set of components corresponding to a similar component in the first set of components;

a measurement clock source operable to generate a measurement clock signal applied to the second and third data registers in order to latch data in the second signal into the second data register and to latch data in the third signal into the third data register; and logic circuitry operable to receive output from the second and third data registers and determine a delay in response thereto.

12. A system according to claim 11, wherein:
the first path is operable to communicate with an external device.

13. A system according to claim 11, wherein:
the measurement clock source is further operable to output a sampling signal input to the first data register for latching data in the first signal.

14. A system according to claim 13, wherein:
the measurement clock source adjusts the sampling signal based on the delay determined by the logic circuitry.

15. A system according to claim 11, wherein:
the first data signal is a differential signal;
the second data signal corresponds to a first part of the differential signal; and
the third data signal corresponds to a second part of the differential signal.

16. A system according to claim 11, wherein:
the first, second, and third signals are derived from a common signal from the measurement clock source.

17. A system according to claim 11, further comprising:
a delay element along the third path in order to introduce a small delay in the third signal relative to the second signal.

18. A method for approximating delays in a programmable device, the programmable device including a first path including a first set of components and a first data register, the first path being operable to carry a first signal useful in operation of an external device, comprising the steps of:

passing a second signal through a second path in the programmable device, the second path including a second set of components including a second data register, the second signal being independent of operation of the external device, each component in the second set of components corresponding to a similar component in the first set of components;

applying a measurement clock signal to the second data register in order to latch data in the second signal into the second data register; and determining a delay for the second signal using output from the second data register.

19. A method according to claim 18, wherein:
the step of applying a measurement clock signal to the second data register further includes sweeping a phase of the measurement clock signal, the measurement clock signal having a frequency that is approximately equal to a frequency of the second signal; and the step of determining a delay for the second signal further includes analyzing the transitions in the output from the second data register resulting from sampling the second signal with the swept phase measurement clock of approximately the same frequency.

20. A method according to claim 18, further comprising:
adjusting a sampling clock signal applied to the first data register in response to the determined delay.

* * * * *